United States Patent
Gould et al.

(10) Patent No.: US 10,175,299 B2
(45) Date of Patent: Jan. 8, 2019

(54) APPARATUS AND METHODS FOR MONITORING AUXILIARY CONTACT STATUS

(71) Applicant: Eaton Corporation, Cleveland, OH (US)

(72) Inventors: Mark Alan Gould, Hendersonville, NC (US); Mark Steven Tomassi, Waynesville, NC (US)

(73) Assignee: Eaton Intelligent Power Limited (IE)

( * ) Notice: Subject to any disclaimer, the term of this patent is extended or adjusted under 35 U.S.C. 154(b) by 304 days.

(21) Appl. No.: 15/057,700

(22) Filed: Mar. 1, 2016

(65) Prior Publication Data

US 2017/0254852 A1    Sep. 7, 2017

(51) Int. Cl.
| | |
|---|---|
| *H01H 3/00* | (2006.01) |
| *G01R 31/327* | (2006.01) |
| *H02J 9/06* | (2006.01) |
| *G01R 31/02* | (2006.01) |
| *H01H 83/04* | (2006.01) |

(52) U.S. Cl.
CPC ....... *G01R 31/327* (2013.01); *G01R 31/3272* (2013.01); *G01R 31/3275* (2013.01); *H02J 9/061* (2013.01); *G01R 31/025* (2013.01); *H01H 2083/045* (2013.01); *Y02T 90/121* (2013.01)

(58) Field of Classification Search
USPC ............................................ 361/42–50, 115
See application file for complete search history.

(56) References Cited

U.S. PATENT DOCUMENTS

| | | | |
|---|---|---|---|
| 5,646,459 A | * | 7/1997 | Hatate ...................... H02J 9/06 307/45 |
| 6,879,060 B2 | | 4/2005 | Hohri |
| 2006/0028069 A1 | * | 2/2006 | Loucks ................... H02J 3/005 307/130 |
| 2011/0222200 A1 | * | 9/2011 | Fuller .................... H01H 9/548 361/100 |
| 2016/0181861 A1 | | 6/2016 | Familiant |

OTHER PUBLICATIONS

Eaton, Transfer switch 101, White Paper WP140001EN, (2015).
Eaton, O&M Manual for 40-1200A (480/600 Vac) ATC-900 3-Position, Open/Closed Transition Contactor Based Transfer Switch (Oct. 2014), 36 pages.
Eaton, Instructions for Installation, Operation and Maintenance of the Eaton TC-900 Open Closed Transition Transfer Switch Controller, Instructional Booklet, (2015), 48 pages.

(Continued)

*Primary Examiner* — Danny Nguyen
(74) *Attorney, Agent, or Firm* — Ward and Smith, P.A.

(57) ABSTRACT

A system includes a circuit interruption device, such as a circuit breaker, contactor or other switch of an automatic transfer switch (ATS) or a similar device providing power to an input of an ATS, and a monitoring circuit, such as a controller of the ATS, coupled to the circuit interruption device and configured to monitor voltages at inputs and outputs of the circuit interruption device, to monitor an auxiliary contact signal associated with auxiliary contacts of the circuit interruption device, and to determine a status of the auxiliary contacts responsive to the monitored voltages and auxiliary contact signal.

18 Claims, 3 Drawing Sheets

(56) References Cited

OTHER PUBLICATIONS

Eaton, Automatic transfer switch (ATS)—contactor-based, Technical Data TD01602018E, (2013), 24 pages.
Cummins Power Generation, Automatic Transfer Switches, (2007) 9 pages.
O & M Manual for 40-1200A (480/600 Vac) ATC-900 3-Position, Open/Closed Transition Contactor Based Transfer Switch (2014), 36 pages.

* cited by examiner

APPARATUS AND METHODS FOR MONITORING AUXILIARY CONTACT STATUS

BACKGROUND

The inventive subject matter relates to power distribution systems and methods and, more particularly, to power distribution systems and methods using auxiliary contacts for signaling status of circuit interruption devices.

Power distribution systems in industrial facilities, data centers and other applications commonly include at least one automatic transfer switch (ATS) that is configured to switch between alternative power sources, such as a utility source and locally-positioned engine/generator set that serves as a backup in the event of a loss of the utility source.

As illustrated in FIG. 1, a typical ATS installation may include an ATS 120 coupled to a utility source 10a and a local motor/generator set (genset) 10b via respective circuit breakers 110a, 110b. The ATS 120 selectively couples the sources 10a, 10b to a load 20 based on the status of the sources 10a, 10b. ATS 120 may include circuit breakers or contactors therein, respective ones of which are used to couple respective ones of the sources 10a, 10b to the load 20. These breakers or contactors may have auxiliary contacts that are used to sense whether the main circuit breaker or contactor contacts are open or closed. An example of an ATS having such capabilities is the Eaton ATC-900, described in *O & M Manual for* 40-1200A (480/600 Vac) ATC-900 *3-Position, Open/Closed Transition Contactor Based Transfer Switch* (2014). It will be appreciated that ATSs may take other forms, e.g., may employ other types of switches.

SUMMARY

Some embodiments of the inventive subject matter provide a system including a circuit interruption device and a monitoring circuit coupled to the circuit interruption device and configured to monitor voltages at inputs and outputs of the circuit interruption device, to monitor an auxiliary contact signal associated with auxiliary contacts of the circuit interruption device, and to determine a status of the auxiliary contacts responsive to the monitored voltages and auxiliary contact signal. The monitoring circuit may be configured to determine a state of the auxiliary contact signal, to determine a state of main contacts of the circuit interruption device from the monitored voltages, and to detect a failure of the auxiliary contacts (e.g., a failure in the contacts themselves and/or a failure in wiring, connectors or other components in the auxiliary contact circuit) from the determined state of the auxiliary contact signal and the determined state of the main contacts. The monitoring circuit may be configured to detect a transition of main contacts of the circuit interruption device from the monitored voltages, to determine a transition time of the auxiliary contacts responsive to the detected transition of the main contacts and the auxiliary contact signal, and to detect a failure of the auxiliary contacts responsive to the determined transition time.

The monitoring circuit may include a controller of an automatic transfer switch (ATS). In some embodiments, the ATS may include the circuit interruption device. In some embodiments, the circuit interruption device may be configured to provide power to an input of the ATS. The circuit interruption device may include a circuit breaker or a contactor.

Further embodiments provide an apparatus including a switching circuit configured to selectively couple first and second power inputs to a power output and a controller configured to control the switching circuit. The controller is further configured to monitor voltages at inputs and outputs of a circuit interruption device of the switching circuit, to monitor an auxiliary contact signal associated with auxiliary contacts of the circuit interruption device, and to determine a status of the auxiliary contacts responsive to the monitored voltages and auxiliary contact signal. The controller may be configured to determine a state of the auxiliary contact signal, to determine a state of main contacts of the circuit interruption device from the monitored voltages, and to detect a failure of the auxiliary contacts from the determined state of the auxiliary contact signal and the determined state of the main contacts. The controller may be configured to detect a transition of main contacts of the circuit interruption device from the monitored voltages, to determine a transition time of the auxiliary contacts responsive to the detected transition of the main contacts and the auxiliary contact signal, and to detect a failure of the auxiliary contacts responsive to the determined transition time. The controller may be configured to control the switching circuit responsive to the determined status of the auxiliary contacts.

Further embodiments provide methods including monitoring voltages at inputs and outputs of a circuit interruption device, monitoring an auxiliary contact signal associated with auxiliary contacts of the circuit interruption device, and determining a status of the auxiliary contacts responsive to the monitored voltages and auxiliary contact signal. Determining a status of the auxiliary contacts responsive to the monitored voltages and auxiliary contact signal may include determining a state of the auxiliary contact signal, determining a state of main contacts of the circuit interruption device from the monitored voltages, and detecting a failure of the auxiliary contacts from the determined state of the auxiliary contact signal and the determined state of the main contacts.

Detecting a failure of the auxiliary contacts from the determined state of the auxiliary contact signal and the determined state of the main contacts may include detecting the failure of the auxiliary contacts from a discrepancy between the detected state of the auxiliary contact signal and the detected state of the main contacts. Determining a status of the auxiliary contacts responsive to the monitored voltages and auxiliary contact signal may include detecting a transition of main contacts of the circuit interruption device from the monitor voltages, determining a transition time of the auxiliary contacts responsive to the detected transition of the main contacts and the auxiliary contact signal, and detecting a failure of the auxiliary contacts responsive to the determined transition time. Detecting a failure of the auxiliary contacts responsive to the determined transition time of the auxiliary contacts may include detecting the transition time exceeding a predetermined threshold.

DETAILED DESCRIPTION

Figure 1:
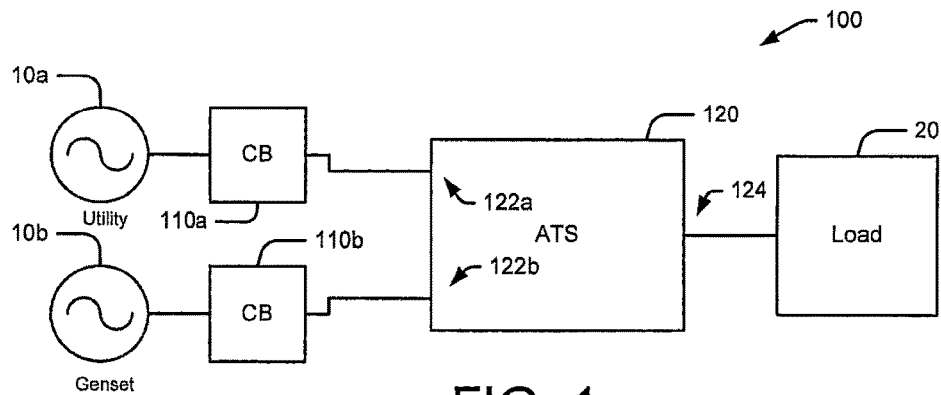
FIG. 1 is a schematic diagram illustrating a conventional application of an automatic transfer switch (ATS).

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Circuit interruption devices, such as circuit breakers, contactors and other switches (mechanical, electromechanical and/or electronic) used in an automatic transfer switch (ATS) may use auxiliary contacts to indicate the state of main switching contacts. Failure of such auxiliary contacts may cause malfunctions. Some embodiments of the inventive subject matter may use voltage measurements on input and output sides of the circuit interruption devices in conjunction with auxiliary contact signals to determine the status of the auxiliary contacts, which may include status of the auxiliary contacts themselves or of other components, such as wiring or connectors, included in the circuitry coupled to the auxiliary contacts that is used in the generation of an auxiliary contact signal. By monitoring input and output voltages, the state of the main contacts may be determined and compared to the information provided by the auxiliary contact signal to determine whether the auxiliary contacts are operating as desired. For example, a mismatch between the state of the auxiliary contacts and a state of the main contacts as indicated by the voltage measurements may indicate a failure of the auxiliary contacts and/or wiring, connectors or other components of the auxiliary contact circuit. The detected voltages and auxiliary contact state may also be used to determine if a delay between operation of the main contacts (e.g., indicated by a sensed voltage) and operation of the auxiliary contacts has increased above a predetermined threshold.

Figure 2:
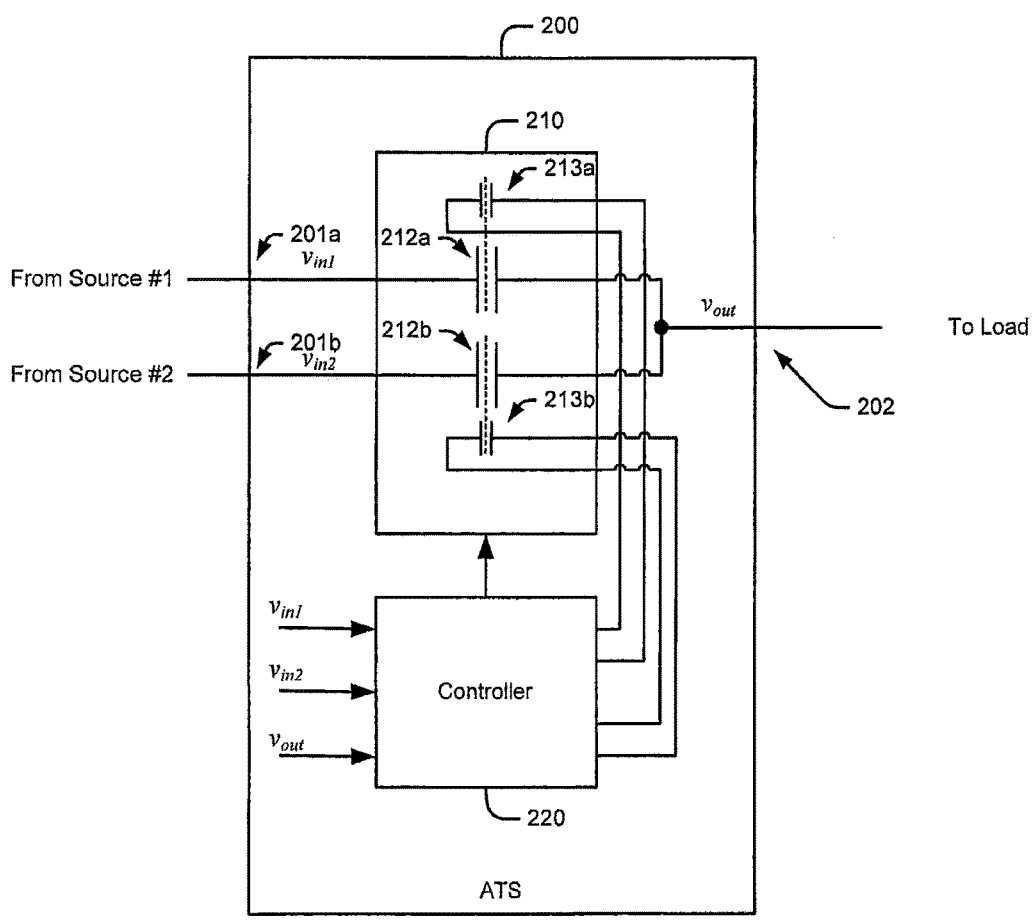
FIG. 2 is a schematic diagram illustrating an ATS according to some embodiments.

FIG. 2 illustrates an ATS 200 according to some embodiments, which may be used, for example, in an application as illustrated in FIG. 1. The ATS 200 includes a switching circuit 210 that is configured to selectively couple power inputs 201a, 201b to a power output 202. As shown, the switching circuit 210 may include respective sets of main contacts 212a, 212b that are configured to couple and decouple respective ones of the inputs 201a, 201b to the output 202. Respective sets of auxiliary contacts 213a, 213b are mechanically linked to the main contacts 212a, 212b and operate in synchronism therewith. The main contacts 212a, 212b and the auxiliary contacts 213a, 213b may be included in respective contactors, for example, but it will be appreciated that other types of switching devices may be used. A controller 220 controls the switching circuit 210, e.g., the main contacts 212a, 212b, responsive to detected input and output voltages $v_{in1}$, $v_{in2}$, $v_{out}$ at the power inputs 201a, 201b and the power output 202. The controller 220 is also configured to receive signals associated with operation of the auxiliary contacts 213a, 213b. The controller 220 may include any of a variety of different analog and/or digital circuits, such as microcontrollers and peripheral circuitry configured to drive the switching circuit 210. The controller 220 may include, for example, a processor, such as a programmable analog and/or digital device that can store, retrieve and process data, including, but not limited to, a microelectronic device (e.g., a microprocessor, microcontroller, digital signal processor (DSP)), a computer, a workstation, a mainframe computer, a networked processor, a programmable logic controller (PLC), or the like.

Figure 3:
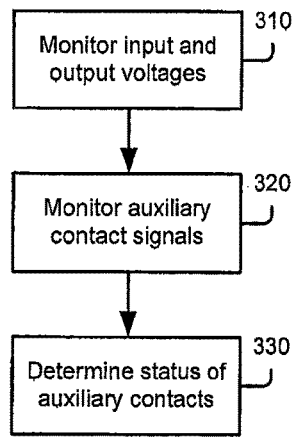
FIGS. 3-5 are flowcharts illustrating operations of the ATS of FIG. 2 according to some embodiments.

FIG. 3 is a flowchart illustrating operations of the ATS 200 of FIG. 2 according to some embodiments. The input voltages $v_{in1}$, $v_{in2}$ and the output voltage $v_{out}$ of the ATS 200 are monitored (block 310). Auxiliary contact signals associated with the auxiliary contacts 213a, 213b are also monitored (block 320). Status of the auxiliary contacts 213a, 213b may be determined based on the monitored voltages and the auxiliary contact signals (block 330). As used herein, "status of the auxiliary contacts" includes status of the contacts themselves as well as status of associated circuitry, such as wiring, connectors and circuitry that drives and/or receives signals from the auxiliary contacts, that are used in conjunction with the auxiliary contacts to generate and/or convey the auxiliary contact signal. It will be understood that failures of any of these components can affect the status of the auxiliary contacts and that "status of the auxiliary contacts" may include, for example, failures of connections to the auxiliary contacts and failures of circuitry that drives or receives signals from the auxiliary contacts, as well as failures of the contacts themselves.

Figure 4:
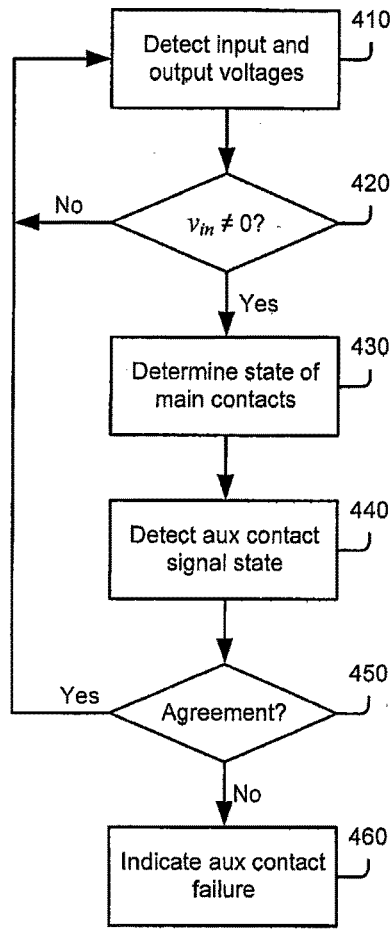

In some embodiments, as shown in FIG. 4, one of the input voltages $v_{in1}$, $v_{in2}$ and the output voltage $v_{out}$ may be monitored and, if the input voltage is non-zero, a state of the main contacts associated with the monitored input voltage may be determined based on a comparison of the input and output voltages (blocks 410, 420, 430). The associated auxiliary contact signal state is detected and, if not in agreement with the determined state of the main contacts, an auxiliary contact failure (e.g., a mechanical or electrical failure of the contacts or connections thereto) may be indicated (blocks 440, 450, 460). The indication may include, for example, the ATS 200 providing a visual, audio, telecommunications or other alert to an operator or other user, who may responsively perform maintenance operations. The indication may also be used to inhibit or otherwise control operation of switching circuitry of the ATS 200.

Figure 5:
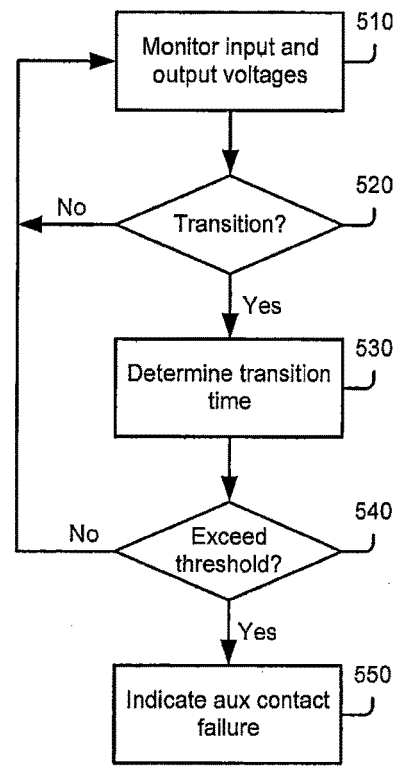

According to further embodiments shown in FIG. 5, input and output voltages associated with one of the main contacts may be monitored and, if a transition of the main contacts is indicated by the detected voltages, a corresponding transition time of the associated auxiliary contact signal may be determined (blocks 510, 520, 530). If the determined transition time of the auxiliary contact signal (for a transition from closed to open or open to closed) exceeds a predetermined threshold, an auxiliary contact failure may be indicated (blocks 540, 550). The indication may include, for example, the ATS 200 providing a visual, audio, telecommunications or other alert to an operator or other user, who may responsive perform maintenance operations. The indication may also be used to inhibit or otherwise control operation of switching circuitry of the ATS 200.

Figure 6:
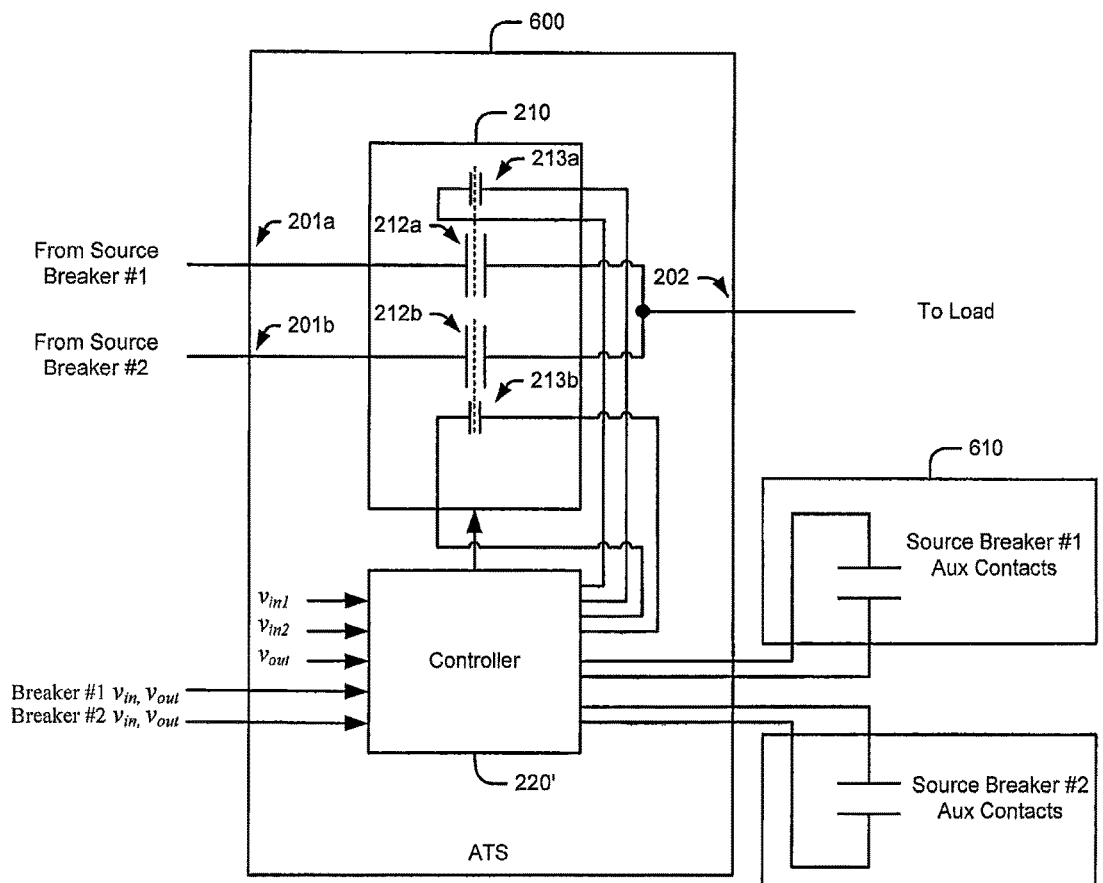
FIG. 6 is a schematic diagram illustrating an ATS according to further embodiments.

According to further embodiments, similar techniques may be used to monitor auxiliary contacts of other circuit interruption devices associated with an ATS, such as auxiliary contacts of circuit breakers that provide power to inputs of the ATS. For example, FIG. 6 illustrates an ATS 600 that includes a switching circuit 210 with main contacts 212a, 212b and auxiliary contacts 213a, 213b as described above with reference to FIG. 2. A controller 220' of the ATS 600 may be configured to monitor status of the auxiliary contacts 213a, 213b as described above, and may be further configured to monitor status of auxiliary contacts of circuit breakers 610, 620 providing power to the inputs 210a, 210b of the ATS 600. The monitoring may involve detection of input and output voltages of the circuit breakers, and may utilize operations along the lines described above with reference to FIGS. 3-5. It will be appreciated that although FIG. 6 illustrates monitoring of circuit breakers 610, 620, similar techniques may be used to monitor other types of switches, such as contactors or other types of mechanical, electromechanical and electronic switches.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. A system comprising:
  a circuit interruption device; and
  a monitoring circuit coupled to the circuit interruption device and configured to monitor voltages at inputs and outputs of the circuit interruption device, to monitor an auxiliary contact signal associated with auxiliary contacts of the circuit interruption device, and to determine a status of the auxiliary contacts responsive to the monitored voltages and auxiliary contact signal, wherein the monitoring circuit is configured to determine a state of the auxiliary contact signal, to determine a state of main contacts of the circuit interruption device from the monitored voltages, and to detect a failure of the auxiliary contacts from the determined state of the auxiliary contact signal and the determined state of the main contacts.

2. The system of claim 1, wherein the monitoring circuit is configured to detect a transition of main contacts of the circuit interruption device from the monitored voltages, to determine a transition time of the auxiliary contacts responsive to the detected transition of the main contacts and the auxiliary contact signal, and to detect a failure of the auxiliary contacts responsive to the determined transition time.

3. The system of claim 1, wherein the monitoring circuit comprises a controller of an automatic transfer switch (ATS).

4. The system of claim 3, wherein the ATS comprises the circuit interruption device.

5. The system of claim 3, wherein the circuit interruption device is configured to provide power to an input of the ATS.

6. The system of claim 1, wherein the circuit interruption device comprises a circuit breaker or a contactor.

7. An apparatus comprising:
  a switching circuit configured to selectively couple first and second power inputs to a power output; and
  a controller configured to control the switching circuit, the controller further configured to monitor voltages at inputs and outputs of a circuit interruption device of the switching circuit, to monitor an auxiliary contact signal associated with auxiliary contacts of the circuit interruption device, and to determine a status of the auxiliary contacts responsive to the monitored voltages and auxiliary contact signal, wherein the controller is configured to determine a state of the auxiliary contact signal, to determine a state of main contacts of the circuit interruption device from the monitored voltages, and to detect a failure of the auxiliary contacts from the determined state of the auxiliary contact signal and the determined state of the main contacts.

8. The apparatus of claim 7, wherein the controller is configured to detect a transition of main contacts of the circuit interruption device from the monitored voltages, to determine a transition time of the auxiliary contacts responsive to the detected transition of the main contacts and the auxiliary contact signal, and to detect a failure of the auxiliary contacts responsive to the determined transition time.

9. The apparatus of claim 7, wherein the controller is configured to control the switching circuit responsive to the determined status of the auxiliary contacts.

10. The apparatus of claim 7, wherein the controller is configured to communicate the determined status to a user.

11. A method comprising:
  monitoring voltages at inputs and outputs of a circuit interruption device;
  monitoring an auxiliary contact signal associated with auxiliary contacts of the circuit interruption device; and
  determining a status of the auxiliary contacts responsive to the monitored voltages and auxiliary contact signal, wherein determining a status of the auxiliary contacts responsive to the monitored voltages and auxiliary contact signal comprises:
  determining a state of the auxiliary contact signal;
  determining a state of main contacts of the circuit interruption device from the monitored voltages; and
  detecting a failure of the auxiliary contacts from the determined state of the auxiliary contact signal and the determined state of the main contacts.

12. The method of claim 11, wherein detecting a failure of the auxiliary contacts from the determined state of the auxiliary contact signal and the determined state of the main contacts comprises detecting the failure of the auxiliary contacts from a discrepancy between the determined state of the auxiliary contact signal and the determined state of the main contacts.

13. The method of claim 11, wherein determining a status of the auxiliary contacts responsive to the monitored voltages and auxiliary contact signal comprises:
  detecting a transition of main contacts of the circuit interruption device from the monitor voltages;
  determining a transition time of the auxiliary contacts responsive to the detected transition of the main contacts and the auxiliary contact signal; and
  detecting a failure of the auxiliary contacts responsive to the determined transition time.

14. The method of claim 13, wherein detecting a failure of the auxiliary contacts responsive to the determined transition time of the auxiliary contacts comprises detecting the transition time exceeding a predetermined threshold.

15. The method of claim 11, performed by an ATS.

16. The method of claim 15, wherein the ATS comprises the circuit interruption device.

17. The method of claim 15, wherein the circuit interruption device provides power to an input of the ATS.

18. The method of claim 11, further comprising communicating the determined status to a user.

* * * * *